United States Patent [19]

Ho et al.

[11] Patent Number: 5,438,254
[45] Date of Patent: Aug. 1, 1995

[54] PHASE DIFFERENCE MEASURING DEVICE

[76] Inventors: Edmond Y. Ho; Fu-chin Yang; Jung-lung Lin, all of 3Fl., No. 48, Park Ave. II, Science-Based Industrial Park, Hsinchu, Taiwan

[21] Appl. No.: 282,180

[22] Filed: Jul. 29, 1994

[51] Int. Cl.⁶ ............................................. G01R 23/02
[52] U.S. Cl. ............................. 324/76.82; 324/76.48; 324/76.62; 327/3; 327/12
[58] Field of Search ................. 377/39, 43; 327/3, 12; 324/76.82, 76.48, 76.62, 76.53

[56] References Cited

U.S. PATENT DOCUMENTS

| | | | |
|---|---|---|---|
| 4,070,618 | 1/1978 | Thomas | 324/76.82 |
| 4,112,709 | 10/1978 | Brown | 324/76.82 |
| 5,019,786 | 5/1991 | Fairley | 324/76.82 |

Primary Examiner—Kenneth A. Wieder
Assistant Examiner—Jose M. Solis
Attorney, Agent, or Firm—Ross, Clapp, Korn & Montgomery

[57] ABSTRACT

A phase difference measuring device includes a phase detector, a low-pass filter/voltage controlled oscillator, a reference signal selector for selecting either an internal reference signal or an external reference signal as a reference signal, a phase comparator for comparing an undertest signal with the selected reference signal and obtaining a phase difference between the two compared signal. The internal reference signal is selected when the undertest signal is a jittering signal, and the external reference signal is selected when the undertest signal is a wandering signal. The undertest signal, the selected reference signal, and a relatively high frequency clock signal from external are sent to the phase comparator and a phase difference between the undertest signal and the selected reference signal is counted by the relatively high frequency clock signal.

2 Claims, 5 Drawing Sheets

PHASE DIFFERENCE MEASURING DEVICE

BACKGROUND OF THE INVENTION

1. Field of the Invention

The present invention relates to a phase difference measuring device especially one which is used in measuring a signal shifting phase when it jitters.

2. Description of the Prior Art

A conventional signal jittering indicator as shown in FIG. 5 comprises a phase detector 50, a low-pass filter/voltage controlled oscillator 60, and an analog-to-digital converter 70. An under-test signal is first sent into the phase detector 50 and a phase difference is outputted from the phase detector 50. The low-pass filter/voltage controlled oscillator 60 receives the phase difference signal and outputs a reference frequency signal. The reference frequency signal is fed back to the phase detector 50 and compared with the under-test signal, in the meanwhile the phase difference signal is sent to the analog-to-digital converter 70 and is converted into a digital signal as an indication of the shifted phase of the undertest signal. A signal wandering indicator is similar to the signal jittering indicator except that a reference frequency signal is provided externally. Both the signal jittering indicator and the signal wandering indicator require an analog-to-digital converter which may be very complicated and high in cost when the indicator is a very high precision indicator. It is known that for a relatively high precision indicator, the converted bit number for each signal cycle is relatively great thus requiring a relatively complicated analog-to-digital converter.

The present invention has arisen to mitigate and/or obviate the afore-described disadvantages of the conventional signal jittering indicator.

SUMMARY OF THE INVENTION

The primary objective of the present invention is to provide a phase difference measuring device which can measure a phase difference between an undertest signal and a reference signal without the necessity of an analog-to-digital converter thus simplifying the structure of the measuring device and reducing cost.

In accordance with one aspect of the invention, there is provided a phase difference measuring device comprising a phase detector, a low-pass filter/voltage controlled oscillator, a reference signal selector for selecting either an internal reference signal or an external reference signal, a phase comparator for comparing an undertest signal with the selected reference signal and obtaining a phase difference between the two compared signals; wherein the phase detector together with the low-pass filter/voltage controlled oscillator constitute a phase lock loop for detecting the phase of the undertest signal; the internal reference signal outputted from the low-pass filter/voltage controlled oscillator and the external reference signal are sent to the reference signal selector, and the internal reference signal is selected when the undertest signal is a jittering signal, and the external reference signal is selected when the undertest signal is a wandering signal; the undertest signal and the selected reference signal are sent to the phase comparator for obtaining a phase difference therebetween; an initialization signal for initializing the phase comparator and a relatively high frequency clock signal for counting the phase difference are sent to the phase comparator; a phase difference between the undertest signal and the selected reference signal is counted in the phase comparator and a digital signal representing the phase difference outputted from the phase comparator.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
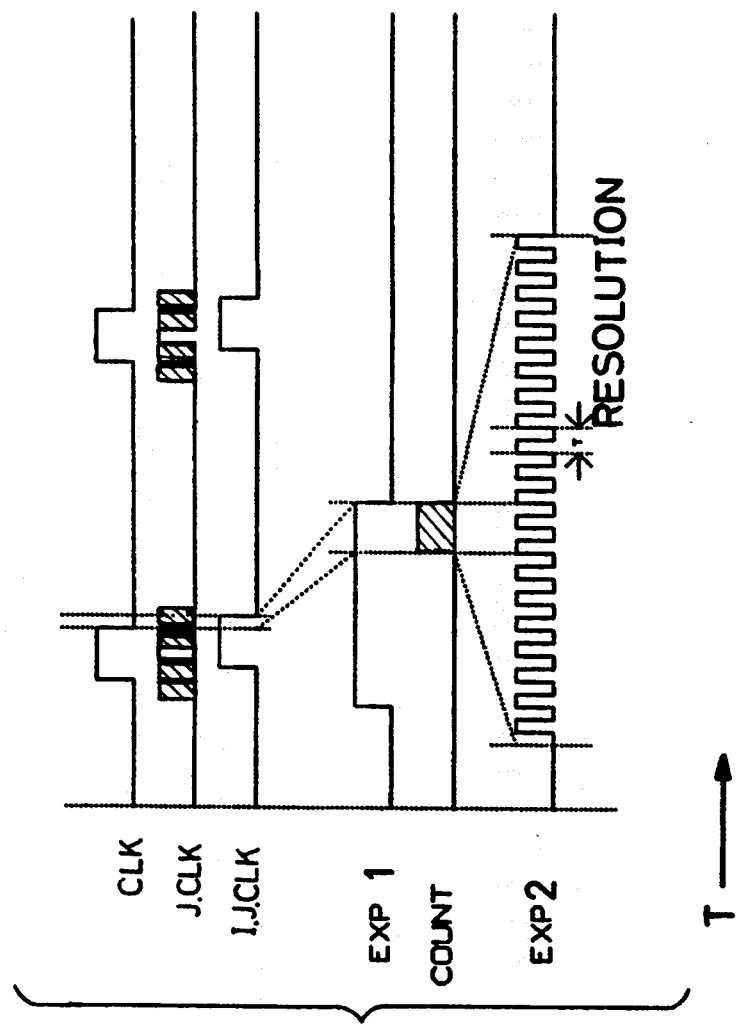
FIG. 1 illustrates the measuring theory by showing a plurality of related pulse waves.

Referring to FIG. 1, the basic theory of the present invention is to obtain a phase difference between an ideal clock signal and a jittered clock signal thereby generating an instantaneous jittered clock signal. A phase difference between the instantaneous jittered clock signal and the ideal clock signal can be expanded as shown in the EXP1 waves for clearly viewing and can be counted by a plurality of relatively high frequency pulses as shown in the COUNT waves which are expanded for visible reason as shown in the EXP2 waves. Therefore, the phase difference between the instantaneous jittered clock signal and the ideal clock signal is quantized by the number of the pulses as shown in the EXP2 waves. In summary, the present invention utilizes a plurality of relatively high frequency pulses to count for a phase difference between an undertest signal, such as a jittered signal, and an ideal clock signal thus avoiding cost of a analog-to-digital converter.

Figure 2:
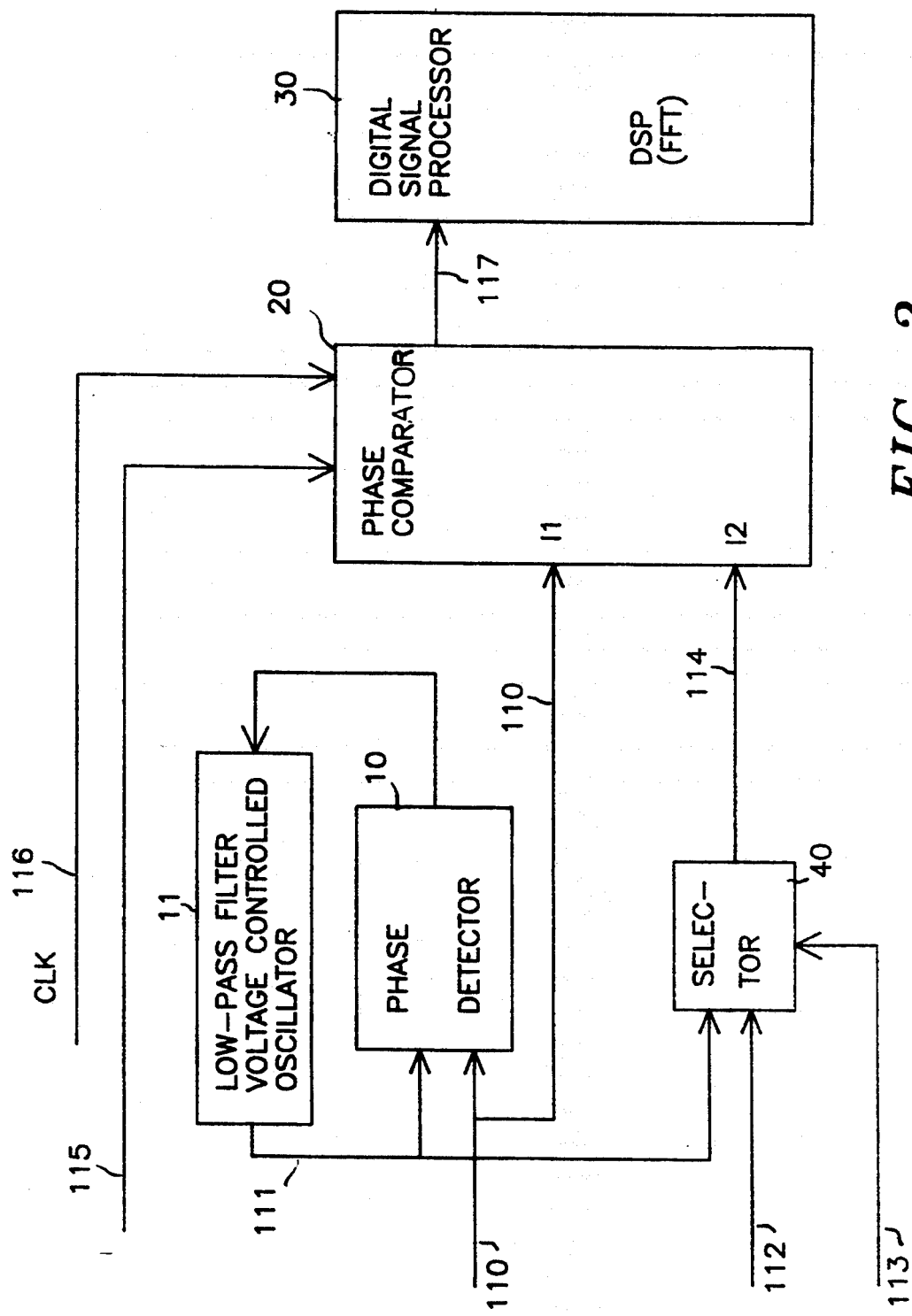
FIG. 2 is a block diagram of a phase difference measuring device in accordance with the present invention.

Referring to FIG. 2, a phase difference measuring device of the present invention comprises a phase detector 10, a low-pass filter/voltage controlled oscillator 11, a reference signal selector 40 for selecting either an internal reference signal or an external reference signal, a phase comparator 20 for comparing an undertest signal with the selected reference signal and obtaining a phase difference between the two compared signals, and a digital signal processor 30. The phase detector 10 together with the low-pass filter/voltage controlled oscillator 11 constitute a phase lock loop for detecting the phase of an undertest signal 110. An internal reference signal 111 outputted from the low-pass filter/voltage controlled oscillator 11 and an external reference signal 112 are sent to the reference signal selector 40 and selected by a selection signal 113 thus only the internal reference signal 111 or the external reference signal 112 is selected and outputted as a reference signal 114 from the reference signal selector 40. It is known that for measuring jittering signal the internal reference signal 111 is selected as the reference signal 114, for measuring wandering signal the external reference signal 112 is selected as the reference signal 114. The undertest signal 110 and the selected reference signal 114 are sent to the phase comparator 20 for obtaining the phase difference between the undertest signal 110 and the selected reference signal 114. An initialization signal 115 for initializing the phase comparator 20 and a relatively high frequency clock signal 116 are also sent to the phase comparator 20. The phase difference of the undertest signal 110 and the selected reference signal 114 is counted in the phase comparator 20 and a digital signal 117 representing the phase difference is outputted from the phase comparator 20. The digital signal 117 is further sent to the digital signal processor 30 for further processing.

Figure 3:
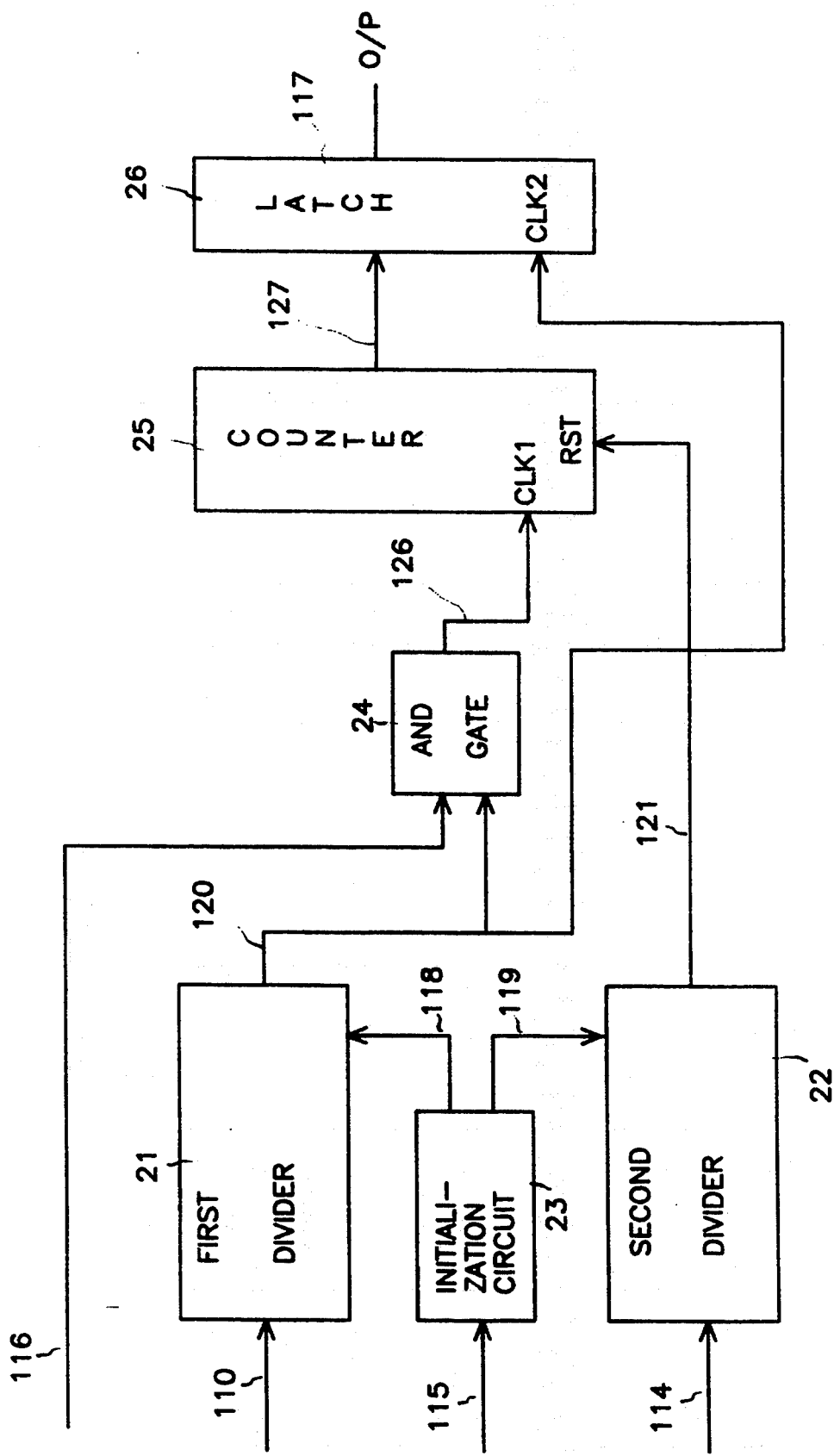
FIG. 3 is a block diagram of a phase comparator in accordance with the present invention.
Figure 4:
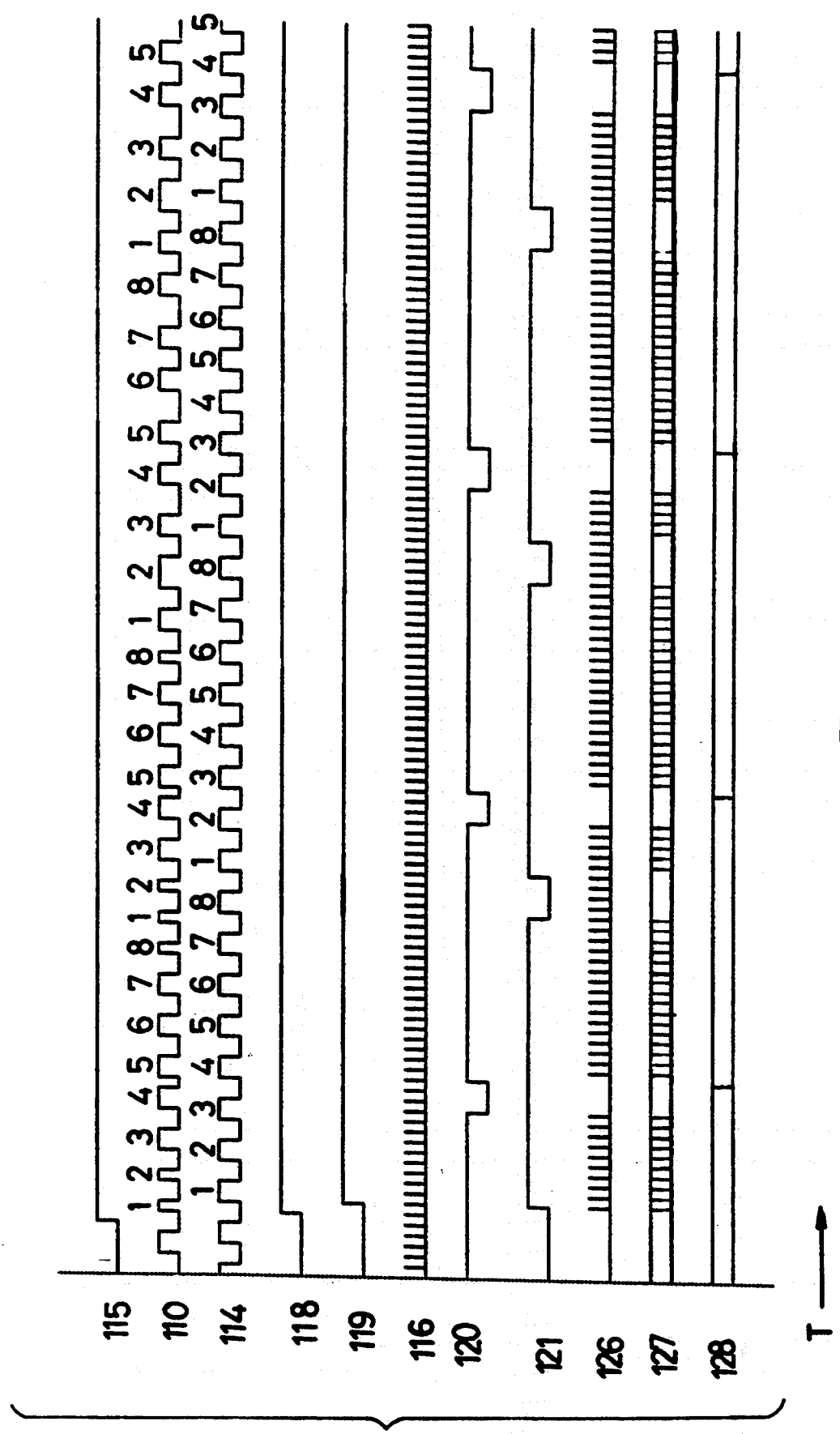
FIG. 4 illustrates a plurality of pulses used in the present invention.
Figure 5:
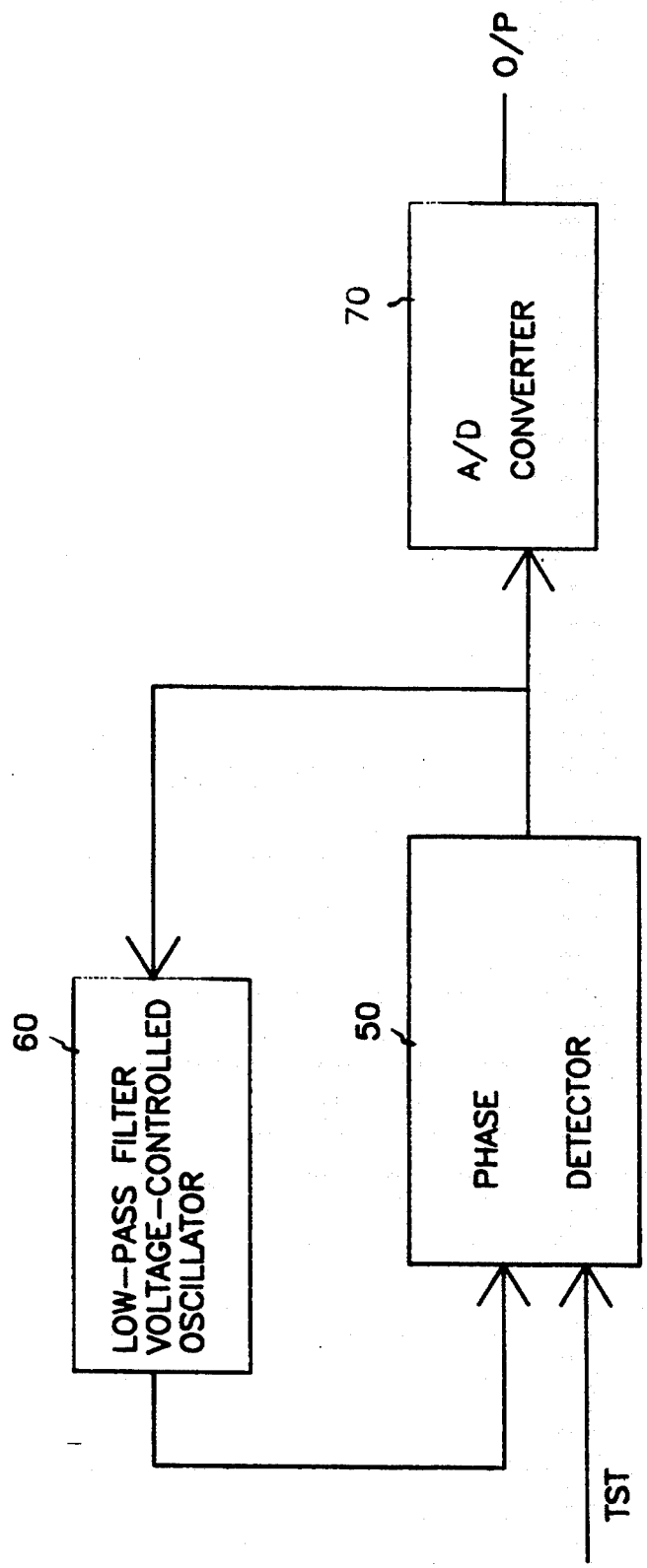
FIG. 5 is a block diagram of a conventional signal jittering indicator.

Referring to FIGS. 3 and 4, the phase comparator 20 comprises a first divider 21 receiving the undertest signal 110 and outputting a first divided signal 120, a second divider 22 receiving the selected reference signal 114 and outputting a second divided signal 121, an initialization circuit 23 receiving the initialization signal 115 and providing a first reset signal 118 to the first divider 21 and a second reset signal to the second divider 22, an AND gate 24 receiving the relatively high frequency clock signal 116 and outputting a clock signal 126, a counter 25 receiving the clock signal 126 and the second divided signal 121 and outputting a counted signal 127, a latch 26 receiving the counted signal 127 and outputting the digital signal 117 representing the phase difference in response to every rising edge of the first divided signal 120. The second divided signal 121 resets the counter 25 at its falling edge of each cycle and enables the counter 25 to count again at its rising edge of each cycle. In this embodiment, the first divider 21 and the second divider 22 respectively divides the undertest signal 110 and the selected reference signal 114 by eight. The precision of the phase difference 117 obtained at the latch 26 could be improved by supplying the clock signal 116 with higher frequency.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

We claim:

1. A phase difference measuring device comprising a phase detector, a low-pass filter/voltage controlled oscillator, a reference signal selector for selecting either an internal reference signal or an external reference signal, a phase comparator for comparing an undertest signal with the selected reference signal and obtaining a phase difference between the two compared signals;

wherein the phase detector together with the low-pass filter/voltage controlled oscillator constitute a phase lock loop for detecting the phase of the undertest signal; the internal reference signal outputted from the low-pass filter/voltage controlled oscillator and the external reference signal are sent to the reference signal selector, and the internal reference signal is selected when the undertest signal is a jittering signal, and the external reference signal is selected when the undertest signal is a wandering signal; the undertest signal and the selected reference signal are sent to the phase comparator for obtaining a phase difference therebetween; an initialization signal for initializing the phase comparator and a relatively high frequency clock signal for counting the phase difference are sent to the phase comparator; a phase difference between the undertest signal and the selected reference signal is counted in the phase comparator and a digital signal representing the phase difference outputted from the phase comparator.

2. A phase difference measuring device as claimed in claim 1, wherein the phase comparator comprises a first divider for receiving the undertest signal and outputting a first divided signal in response, a second divider for receiving the selected reference signal and outputting a second divided signal in response, an initialization circuit for receiving the initialization signal and providing a reset signal to the first and the second dividers, an AND gate coupled to receive the relatively high frequency clock signal and output a clock signal in response,.a counter coupled to receive the clock signal and the second divided signal and output a counted signal, a latch coupled to receive the counted signal and output the digital signal representing the phase difference in response to every rising edge of the first divided signal; wherein the second divided signal resets the counter at its falling edge of each cycle and enables the counter to count again at its rising edge of each cycle.

* * * * *